United States Patent
Schicht et al.

(10) Patent No.: US 8,043,707 B2
(45) Date of Patent: Oct. 25, 2011

(54) HIGHLY HEAT-RESISTANT LOW-EMISSIVITY MULTILAYER SYSTEM FOR TRANSPARENT SUBSTRATES

(75) Inventors: Heinz Schicht, Bethau (DE); Uwe Schmidt, Falkenberg (DE); Pierre-Alain Gillet, Mareil-Marly (FR)

(73) Assignee: Saint-Gobain Glass France, Courbevoie (FR)

( * ) Notice: Subject to any disclaimer, the term of this patent is extended or adjusted under 35 U.S.C. 154(b) by 182 days.

(21) Appl. No.: 12/295,090

(22) PCT Filed: Mar. 28, 2007

(86) PCT No.: PCT/FR2007/051032
§ 371 (c)(1),
(2), (4) Date: Jan. 8, 2009

(87) PCT Pub. No.: WO2007/110552
PCT Pub. Date: Oct. 4, 2007

(65) Prior Publication Data
US 2010/0178492 A1    Jul. 15, 2010

(30) Foreign Application Priority Data
Mar. 29, 2006 (DE) .................... 10 2006 014 796

(51) Int. Cl.
*B32B 17/06*    (2006.01)
(52) U.S. Cl. ........ 428/432; 428/423; 428/689; 428/698; 428/699; 428/701; 428/702; 428/704
(58) Field of Classification Search ............... 428/423, 428/432, 689, 697, 699, 701, 702, 704
See application file for complete search history.

(56) References Cited

U.S. PATENT DOCUMENTS

| | | | |
|---|---|---|---|
| 6,060,178 A | 5/2000 | Krisko | |
| 7,074,485 B2 | 7/2006 | Schicht et al. | |
| 7,211,328 B2 | 5/2007 | Schicht et al. | |
| 2003/0049464 A1 * | 3/2003 | Glenn et al. ................. | 428/432 |

FOREIGN PATENT DOCUMENTS
WO    WO 2005/100275 A1    10/2005

OTHER PUBLICATIONS

U.S. Appl. No. 12/295,090, filed Feb. 21, 2008, Ihlo, et al.
Z. Y. Chen, et al., "Growth of titanium nitride: From clusters to microcrystals", J. Chem. Phys., XP-002449161, vol. 98, No. 1, Jan. 1, 1993, pp. 231-235.

* cited by examiner

*Primary Examiner* — Gwendolyn Blackwell
(74) *Attorney, Agent, or Firm* — Oblon, Spivak, McClelland, Maier & Neustadt, L.L.P.

(57) ABSTRACT

A low-emissivity multilayer system highly resistant to heat treatment for transparent substrates, in particular for window panes comprises, starting from the substrate, at least a lower antireflection coating consisting of several partial layers and including a layer essentially consisting of ZnO which is adjacent with a silver-based functional layer, an essentially metallic blocking layer located on top of the silver-based layer, an upper antireflection coating consisting of several partial layers and a cover coating optionally consisting of several partial layers. The upper antireflection coating has: a partial layer of ZnO or a mixed oxide $ZnMeO_x$ that contains ZnO or a succession of layers of mixed oxides of the $ZnO:Al/ZnMeO_x$ type; a partial layer of $Si_3N_4$ or $Si_xO_yN_z$; and between these two partial layers, a separating layer with a thickness of 0.5 to 5 nm, consisting of a metal oxide or a mixed oxide with a cubic crystal lattice, which prevents direct contact between these two partial layers. Coated window panes that are highly resistant to technical handling operations comprising an inserted separating layer that makes it possible to further improve the mechanical and chemical properties of the multilayer system.

18 Claims, No Drawings

HIGHLY HEAT-RESISTANT LOW-EMISSIVITY MULTILAYER SYSTEM FOR TRANSPARENT SUBSTRATES

The present application is the U.S. counterpart of WO 07/110,552, the text of which is incorporated by reference and claims the priority of the German Application No. 102006014796.0 filed on Mar. 29, 2006, the text of which is incorporated by reference.

The invention relates to a low-emissivity multilayer system highly resistant to heat treatment for transparent substrates, in particular for window panes, which system has, starting from the substrate, at least a lower antireflection coating consisting of several partial layers and including a layer essentially consisting of ZnO which is adjacent with a silver-based functional layer, an essentially metallic blocking layer located on top of the silver-based layer, an upper antireflection coating consisting of several partial layers and a cover coating optionally consisting of several partial layers, the layers being applied by vacuum sputtering.

The present invention also relates to glazing incorporating at least one substrate bearing a multilayer system according to the invention.

The expression "highly heat-resistant multilayer systems" is understood to mean multilayer systems that withstand temperatures of about 600-750° C., such temperatures being necessary for the operation of bending and/or toughening glass substrates without being destroyed or losing their essential properties, namely high transmission in the visible range of the spectrum, high reflection in the thermal radiation range, low dispersion, high color neutrality, high mechanical strength and high chemical resistance. In the subsequent technical treatment of window panes on which they are preferably deposited, these multilayer systems are also called "toughenable" and/or "bendable" systems. Fundamentally, it is of course also possible to deposit these multilayer systems on substrates that are not subsequently heat treated. Thus, these known multilayer systems and the multilayer systems according to the invention are also suitable for plastic transparent substrates.

The term "functional layers" refers to generally metallic layers that can be used intrinsically for thermal insulation (heat reflection). In many cases, the functional layer of current multilayer systems is based on silver or consists essentially of silver (which has a positive effect on the color neutrality of the multilayer system), but other materials are also known for functional layers, for example gold and copper.

Various embodiments of highly heat-resistant multilayer systems are known. In a first group of highly heat-resistant multilayer systems, the antireflection layers all consist of silicon nitride ($Si_3N_4$) which is separated from the silver functional layer by thin blocking layers made of CrNi and/or $NiCrO_x$.

Multilayer systems having these structures are for example described in the documents EP 0 567 735 B1, EP 0 717 014 B1, EP 0 771 766 B1, EP 0 646 551 B1, EP 0 796 825 B1, EP 1 446 364 B1 and EP 1 174 397 A2. In the multilayer system described in document EP 0 883 584 B1, the blocking layers placed between the silver layer and the $Si_3N_4$ antireflection layers consist of silicon.

In another group of highly heat-resistant multilayer systems that have a silver layer as functional layer, the antireflection layers consist of oxide layers. These multilayer systems in which the antireflection layers consist of pure oxides are described for example in documents DE 198 52 358 C1, EP 0 991 92 B1, EP 1 538 131 A1 and WO 2004/058660 A1.

These multilayer systems may also be provided with an upper layer made of a metal nitride, in particular $Si_3N_4$.

Document EP 0 718 250 B1 teaches toughenable multilayer systems provided with oxide, nitride or carbide antireflection layers in which the silver-based functional layer is covered with a metallic blocking layer that may for example consist of Nb, Ta, Ti, Cr or Ni or an alloy of at least two of these metals. In one embodiment, a thin ZnO intermediate layer is placed between the Nb blocking layer placed on the silver layer and the $Si_3N_4$ upper antireflection layer.

Document DE 102 35 154 B4 discloses a highly heat-resistant multilayer system of the type indicated at the beginning and provided with a blocking layer based on a titanium alloy. That document also presents multilayer systems in which an optionally Al-doped ZnO layer is applied on the metallic blocking layer, an $Si_3N_4$ layer, which forms part of the upper antireflection coating like the ZnO layer being placed on this ZnO layer.

Document DE 101 05 199 C1 teaches a highly heat-resistant multilayer structure provided with oxide antireflection layers, in which structure an intermediate layer with a thickness of 0.5 to 5 nm of a metal nitride, for example $Si_3N_4$ or AlN is placed between the silver layer and the metallic blocking layer placed on top of the silver layer.

Document EP 1 238 950 A2 and document EP 1 583 723 A1 describe toughenable multilayer systems that optionally have several silver functional layers and nitride antireflection layers or nitride partial layers that form the antireflection layers, and in which a succession of $NiCrO_x/SnO_2/Si_3N_4$ layers is placed on top of the silver functional layer.

Document DE 103 51 616 A1, which also relates to highly heat-resistant multilayer systems, also discloses multilayer systems that have the succession of layers: $Ag/Si_3N_4/ZnO/SnO/Si_3N_4$.

Document WO 97/48649 also describes highly heat-resistant multilayer systems that are provided with silver functional layers and $Si_3N_4$ antireflection layers. According to that document, the succession of layers located on top of the silver upper layer may also consist of $Nb/ZnO/TiN/Si_3N_4$.

Stringent requirements not only in terms of heat resistance but also in terms of mechanical and chemical properties are imposed on toughenable or bendable multilayer systems. During transportation within the company, cutting and grinding of the window panes, during the washing operation in washing machines, during transport through the toughening and/or bending furnace and during subsequent transport and treatment operations (which collectively will be referred to below as "handling operations"), these layers are exposed to high stresses that may easily result in damage to the multilayer system.

The problem at the bases of the invention is to further improve the mechanical and chemical properties of highly heat-resistant multilayer systems and to develop multilayer systems that exhibit good optical properties and are highly resistant to technical handling operations.

The invention solves this problem with the provisions described in embodiment 1:

a low-emissivity multilayer system highly resistant to heat treatment for transparent substrates, in particular for window panes, which system has, starting from the substrate, at least a lower antireflection coating consisting of several partial layers and including a layer essentially consisting of ZnO which is adjacent with a silver-based functional layer, an essentially metallic blocking layer located on top of the silver-based layer, an upper antireflection coating consisting of several partial layers and a cover coating optionally consisting of several partial layers, the layers being applied by vacuum sputtering, characterized in that the upper antireflection coating has:

a partial layer of ZnO or a mixed oxide $ZnMeO_x$ that contains ZnO or a succession of layers of mixed oxides of the $ZnO:Al/ZnMeO_x$ type;

a partial layer of $Si_3N_4$ or $Si_xO_yN_z$; and between these two partial layers, a separating layer with a thickness of 0.5 to 5 nm, consisting of a metal oxide or a mixed oxide with a cubic crystal lattice, which prevents direct contact between these two partial layers. Other dependent embodiments disclosed herein disclose particularly advantageous features.

Although it is basically possible already to obtain a relatively high hardness and good handling properties of the multilayer system with the known succession of $Si_3N_4/ZnO$ on top and/or beneath the silver layer, with this succession of layers it is sometimes observed that there are quality defects in the subsequent production and treatment operations. Surprisingly, these quality defects may be avoided by inserting, according to the invention, a separating layer made of a metal oxide or a mixed oxide with a cubic crystal lattice.

One cause of the sensitivity of the succession of $Si_3N_4/Zno$ and $ZnO/Si_3N_4$ layers could be that there is no boundary layer established. This is because $Si_3N_4$ is an amorphous material that has pronounced isotropic properties, whereas ZnO is a crystalline material with very dense hexagonal packing and anisotropic properties. The anisotropy is caused by the spatial structure of the lattice and is for example manifested in the elasticity, hardness, capability of debonding, and thermal elongation, and this being also a function of the dependence of these properties on the direction. However, the layer of a crystalline material having a cubic lattice inserted as separating layer is isotropic from the optical standpoint, but as regards its mechanical properties it behaves as an anisotropic material. Thus, it fulfills two functions and acts in this way as layer that reinforces the bonding between the $Si_3N_4$ layer and the ZnO layer.

Examples of materials suitable for the separating layer having a cubic crystal lattice are layers based on or consisting of $NiCrO_x$, $Al_2O_3$, $MgAlO_x$, $TiAlO_x$, $NiAlO_x$ and NiO. The mixed oxide layer that contains ZnO may be based on or consist of $ZnSnO_x$, $ZnAlO_x$, $ZnBiO_x$, $ZnSbO_x$, or $ZnInO_x$ (as is usual, the subscripted letters indicate numbers allowing a certain stoichiometry to be obtained).

The succession of partial layers of the upper antireflection coating proposed by the invention, that is to say the arrangement of a separating layer made of a metal oxide or a mixed oxide having a cubic crystal lattice between the partial layer that contains ZnO and, in an advantageous development of the invention, the silicon nitride partial layer may, as an alternative or in addition, also be produced within the lower antireflection coating of the multilayer system. Thus, it is possible within the context of the preamble of embodiment 1 to produce a lower antireflection coating and/or an upper antireflection coating that has:

a partial layer of ZnO or a mixed oxide $ZnMeO_x$ that contains ZnO or a succession of layers of mixed oxides of the $ZnO:Al/ZnMeO_x$ type;

a partial layer of $Si_3N_4$ or $Si_xO_yN_z$; and between these two partial layers, a separating layer with a thickness of 0.5 to 5 nm, consisting of a metal oxide or a mixed oxide with a cubic crystal lattice, which prevents direct contact between these two partial layers.

According to the invention, the multilayer systems may also have in particular the arrangements of the partial layers given below:

substrate $(glass)/Si_3N_4/ZnO:Al/Ag/NiCr/ZnO:Al/NiCrO_x/Si_3N_4/(topcoat)$;

substrate $(glass)/Si_3N_4/NiCrO_x/ZnO:Al/Ag/NiCr/ZnO:Al/NiCrO_x/Si_3N_4/(topcoat)$;

substrate $(glass)/Si_3N_4/ZnSnO_x/ZnO:Al/Ag/NiCr/ZnO:Al/NiCrO_x/Si_3N_4/(topcoat)$;

substrate $(glass)/Si_3N_4/NiCrO_x/ZnSnO_x/ZnO:Al/Ag/NiCr/ZnO/ZnSnO_x/NiCrO_x/Si_3N_4/(topcoat)$.

It is also possible to improve the mechanical strength properties of the multilayer system with topcoats based on certain TiZrHf compounds.

A first advantageous topcoat consists of $TiZrHf(C_xO_yN_z)$. This topcoat is sputtered from a TiZrHf metal target with $N_2$ as working gas to which 0.5% of $CH_4$ has been added. However, it is also possible to dispense with the addition of $CH_4$ and to obtain the necessary carbon in the working gas that surrounds the TiZrHf target by the hydrocarbons present in the pumping system having a low level of suction capacity, as also basically disclosed in document EP 0 270 024 B1 in which the sputtering of $TiC_xO_yN_z$ layers. The incorporation of oxygen takes place immediately when the layer comes into contact with the atmosphere. Using AES (Auger electron spectroscopy) and XPS/ESCA (electron spectroscopy for chemical analysis), it has been possible to demonstrate that the topcoat thus prepared has a homogeneous TiZrHf/carboxynitride structure. The existence of such a structure is known in the specialized literature (see for example the German journal Hochvakuum, Grenzflächen/Dünne Schichten, volume 1, March 1984, page 142 and the journal Thin Solid Films, 100 (1983), pages 193 to 201, entitled "The microhardness of reactively sputtered $TiC_xO_yN_z$ films".

Document WO 2004/71984 A1 discloses toughenable multilayer systems in which the topcoat may consist of oxynitrides, oxycarbides and carbonitrides of Ti, Zr and other elements of groups IVb, Vb and VIb of the Periodic Table. However, these known multilayer systems are mixtures of individual compounds and this topcoat does not have a structure identical to the complex and homogeneous bonding structure produced in the invention.

Another advantageous topcoat consists of a pure $TiZrHfYO_x$ oxidized layer. This oxidized topcoat is preferably sputtered from an oxidized conducting ceramic target that contains 5 to 10% by weight of $Y_2O_3$ relative to the $ZrO_2$ content. This layer is preferably sputtered from a tubular target in an $Ar/O_2$ working atmosphere.

The invention will now be described by means of two illustrative examples that are compared with a comparative example of the prior art. Since the provisions according to the invention have to improve in particular the mechanical strength and the hardness, to evaluate the properties of the layers on coated window panes, the measurements and tests indicated below were carried out.

A. Taber Test (from the Company Taber Industries)

In this test, an untoughened coated test specimen is clamped in the apparatus and treated using a friction roller of the CS-10 F type, by making the friction roller rotate for 50 revolutions under a load of 500 g. The coating treated in this way is evaluated under a microscope. The results of this test are indicated as the percentage of the layers still present.

B. Erichsen Scratch Test on Untoughened Test Specimens

A circular scratch is created on untoughened coated test specimens measuring $10 \times 10$ $cm^2$ in the layer using a point of the "van Laar" type under a load of 5 N. Next, the test specimen is thermally toughened and the width of the scratch measured under a microscope. The narrower the scratch, the less the coating has been stressed and the better the quality of the coating.

C. Erichsen Scratch Test on Toughened Test Specimens

Circular scratches are produced on the same apparatus as in test B, under an increasing load, in the coating on prestressed test specimens measuring 10×10 cm$^2$, and the loads at which an interrupted scratch is observed and the loads at which a continuous scratch is observed are determined.

D. Erichsen Scrubbing Test on Unprestressed Test Specimens

Unprestressed coated test specimens are subjected to an Erichsen scrubbing test according to the ASTM 2486 standard. This test measures to what extent it is possible to observe defects in the coating after 300 strokes.

E. Erichsen Scrubbing Test on Prestressed Test Specimens

Coated test specimens with dimensions of 10×40 cm$^2$ are toughened in a toughening furnace and subjected to the same scrubbing test. The number of strokes at which one starts to observe debonding of the coating is measured.

F. Measurement of the Scratch Resistance by Our Own Test Method

In this measurement, a needle loaded with a certain weight is drawn over the coating at a defined rate, both before the toughening (b) and after the toughening (a). The weight g for which traces of scratches are visible is a measure of the scratch resistance.

G. Steel Wool Test

In this test, a steel wool pad is passed under slight pressure over the coating of an untoughened test specimen. This is considered to pass the test when no scratch can be seen.

H. Alcohol Test

This test is carried out after the prestressing, by rubbing the coating using an alcohol-impregnated rag. No friction spot can be seen.

I. Measurements Using the Light Scattering Measurement Apparatus from the Company Gardner I.1. measurement of the dispersed light before (b) and after (a) the toughening.

I.2. measurement of the transmission before (b) and after (a) the toughening.

Comparative Example

A low-emissivity multilayer system corresponding to the prior art was applied to window panes of float glass with a thickness of 4 mm in an industrial continuous coating plant in which it was possible to use all types of targets, namely with flat targets and tubular targets, under AC current and/or DC current conditions, using reactive magnetron sputtering (i.e. reactive cathode sputtering sustained by a magnetic field), the numbers given before the chemical symbol representing the thickness of each individual layer in nm:
glass/25Si$_3$N$_4$/9ZnO:Al/11.5Ag/3.5NiCr/5ZnO:Al/33Si$_3$N$_4$/2Zn$_2$TiO$_4$.

The ZnO:Al layers were sputtered from a ZnAl metal target containing 2% Al by weight. The blocking layer placed on the silver layer was sputtered with argon as working gas from an NiCr metal target consisting of 80% Ni by weight and 20% Cr by weight. The silicon nitride upper antireflection layer was sputtered under reactive conditions with an Ar/N$_2$ working gas from an Si target and the upper topcoat was also sputtered under reactive conditions with Ar/O$_2$ as working gas from a metal target made of a ZnTi alloy that contains 73% Zn by weight and 27% Ti by weight. The test specimens needed for carrying out the abovementioned tests were cut from the coated pane.

When the test specimens had to be prestressed, this was carried out in a high-performance furnace of the 47067 type from Efco that meets the standards of the technology.

The properties were determined on the test specimens of the comparative example using the abovementioned tests:

| | | |
|---|---|---|
| A. | Taber test: | 80% |
| B. | Width of the scratch in the Erichsen scratch test: | 160-180 μm |
| C. | Visual evaluation of the scratches: | continuous scratches 1 N |
| D. | Scrubbing test on untoughened glass: | onset of coating debonding after 30 passes |
| E. | Scrubbing test on toughened glass: | defect-free coating |
| F. | Scratch resistance: | (b): 55-64 g; (a): 15-20 g |
| G. | Steel wool test: | scratch spot |
| H. | Alcohol test: | no visible spot |
| I1. | Light scattering: | (b): 0.17%; (a): 0.30% |
| I2. | Transmission: | (b): 84%; (a): 89% |

Illustrative Example 1

A float glass pane with a thickness of 4 mm was coated in the same continuous coating plant as that used in the comparative example with the following multilayer system:
glass/25Si$_3$N$_4$/9ZnO:Al/11.5Ag/3.5NiCr/5ZnO:Al/2.5NiCrO$_x$/33Si$_3$N$_4$/2TiZrHf(C$_x$O$_y$N$_z$)

The ZnO:Al layers, the NiCr layer and the Si$_3$N$_4$ layers were sputtered under the same conditions as those indicated with regard to the comparative example. The NiCrO$_x$ layer was also sputtered from an 80/20 NiCr layer, but under reactive conditions with as working gas an Ar/O$_2$ mixture (250/90 cm$^3$ under standard conditions). The target used for depositing the TiZrHf(C$_x$O$_y$N$_z$) topcoat consisted of a TiZrHf alloy consisting of 55% Ti by weight, 44% Zr by weight and 1% Hf by weight and was sputtered with an Ar/N$_2$ mixture as working gas. Carbon was incorporated into the topcoat from the residual gas present in the plant after lowering the suction power on this cathode and oxygen was also incorporated from the residual gas, but also from the atmosphere after the topcoat had been brought into contact with the external atmosphere. The XPS/ESCA and AES measurements carried out on this topcoat corresponded well to the data in the Me-carboxynitride structure disclosed in the literature.

The following properties were determined on this product using the abovementioned tests:

| | | |
|---|---|---|
| A. | Taber test: | 87% |
| B. | Width of the scratch in the Erichsen scratch test: | 80 μm |
| C. | Visual evaluation of the scratches: | continuous scratches 7 N |
| D. | Scrubbing test on untoughened glass: | onset of coating debonding after 200 passes |
| E. | Scrubbing test on toughened glass: | defect-free coating |
| F. | Scratch resistance: | (b): 141-450 g; (a): 60-80 g |
| G. | Steel wool test: | no visible spot |
| H. | Alcohol test: | no visible spot |
| I1. | Light scattering: | (b): 0.17%; (a): 0.18% |
| I2. | Transmission: | (b): 74.4%; (a): 87% |

The transmission (74.4%) of the test specimen before prestressing was therefore relatively low because the TiZrHf (C$_x$O$_y$N$_z$) topcoat was relatively highly absorbent. It was only after the toughening heat treatment operation that the nitride and carbide components were decomposed to nonabsorbent oxides.

Illustrative Example 2

A float glass pane with a thickness of 4 mm was coated in the same continuous coating plant as that used in the comparative example with the multilayer system below:
glass/25$Si_3N_4$/2.5$NiCrO_x$/9ZnO:Al/11.5Ag/3.5NiCr/5ZnO:Al/2.5$NiCrO_x$/$Si_3N_4$/2$TiZrHfYO_x$.

The $TiZrHFYO_x$ topcoat was deposited from a tubular target made of a ceramic consisting of a conducting oxidized material. The oxidized material was prepared from a metal alloy containing 56% Ti by weight, 40% Zr by weight, 1% Hf by weight and 3% Y by weight. The other layers were sputtered under the same conditions as in the previous example.

The following properties were determined on this product using the abovementioned tests:

| | | |
|---|---|---|
| A. | Taber test: | 90% |
| B. | Width of the scratch in the Erichsen scratch test: | 50-60 μm |
| C. | Visual evaluation of the scratches: | continuous scratches 10 N |
| D. | Scrubbing test on untoughened glass: | onset of coating debonding after 450 passes |
| E. | Scrubbing test on toughened glass: | defect-free coating |
| F. | Scratch resistance: | (b): 139-366 g; (a): 80-105 g |
| G. | Steel wool test: | no visible spot |
| H. | Alcohol test: | no visible spot |
| I1. | Light scattering: | (b): 0.18%; (a): 0.18% |
| I2. | Transmission: | (b): 84%; (a): 87% |

After prestressing the coated pane, this multilayer system was reproducibly free of roughness and haze when examined in daylight at a grazing angle or under halogen light.

The invention claimed is:

1. A low-emissivity multilayer system comprising:
   a substrate bearing,
   a lower antireflection coating consisting of several partial layers and including
      a layer consisting essentially of ZnO which is adjacent to a silver-based functional layer,
   a metallic blocking layer located on top of the silver-based layer,
   an upper antireflection coating consisting of several partial layers and
   a cover coating, which itself may optionally consist of several partial layers applied by vacuum sputtering,
   wherein the upper antireflection coating comprises:
      a partial layer of ZnO or a mixed oxide $ZnMeO_x$, wherein x indicates a stoichiometric amount of O in relation to Zn and Me, that contains ZnO or a succession of layers of mixed oxides comprising ZnO:Al/$ZnMeO_x$, wherein x indicates a stoichiometric amount of O in relation to Zn and Me and wherein Me is Sn, Al, Bi, Sb or In;
      a partial layer of $Si_3N_4$ or $Si_xO_yN_z$, wherein x, y and z indicate stoichiometric amounts of Si, O and N, respectively; and
      between and in direct contact with these two partial layers, a separating layer with a thickness of 0.5 to 5 nm, consisting of a metal oxide or a mixed oxide with a cubic crystal lattice, which prevents direct contact between the two partial layers.

2. The multilayer system of claim 1, wherein the separating layer in the upper antireflection coating comprises $NiCrO_x$, wherein x indicates a stoichiometric amount of O in relation to Ni and Cr, $Al_2O_3$, $MgAlO_x$, wherein x indicates a stoichiometric amount of O in relation to Mg and Al, $TiAlO_x$, wherein x indicates a stoichiometric amount of O in relation to Ti and Al, $NiAlO_x$, wherein x indicates a stoichiometric amount of O in relation to Ni and Al, or NiO.

3. The multilayer system of claim 1, wherein the mixed oxide that contains ZnO comprises $ZnSnO_x$, wherein x indicates a stoichiometric amount of O in relation to Zn and Sn, $ZnAlO_x$, wherein x indicates a stoichiometric amount of O in relation to Zn and Al, $ZnBiO_x$, wherein x indicates a stoichiometric amount of O in relation to Zn and Bi, $ZnSbO_x$, wherein x indicates a stoichiometric amount of O in relation to Zn and Sb, or $ZnInO_x$, wherein x indicates a stoichiometric amount of O in relation to Zn and In.

4. The multilayer system of claim 1, wherein the partial layer made of ZnO or a mixed oxide that contains ZnO or consists of a succession of mixed oxides comprising ZnO:Al/$ZnMeO_x$, wherein x indicates a stoichiometric amount of O in relation to Zn and Me, is placed directly on the metallic blocking layer.

5. The multilayer system of claim 1, wherein the lower antireflection coating also has:
   a partial layer of ZnO or a mixed oxide $ZnMeO_x$, wherein x indicates a stoichiometric amount of O in relation to Zn and Me, that contains ZnO or a succession of layers of mixed oxides comprising ZnO:Al/$ZnMeO_x$, wherein x indicates a stoichiometric amount of O in relation to Zn and Me;
   a partial layer of $Si_3N_4$ or $Si_xO_yN_7$, wherein x, y and z indicate stoichiometric amounts of Si, O and N, respectively; and
   between and in direct contact with these two partial layers, a separating layer with a thickness of 0.5 to 5 nm, consisting of a metal oxide or a mixed oxide with a cubic crystal lattice, which prevents direct contact between these two partial layers.

6. The multilayer system of claim 1, further comprising a topcoat placed on top of the upper antireflection coating consisting of TiZrHf($C_xO_yN_z$), wherein x, y and z indicate stoichiometric amounts of C, O and N, respectively.

7. The multilayer system of claim 1, further comprising a topcoat placed on top of the upper antireflection coating consisting of $TiZrHfYO_x$, wherein x indicates a stoichiometric amounts of O in relation to Ti, Zr, Hr and Y.

8. The multilayer system of claim 1, which comprises a layer structure: substrate/$Si_3N_4$/ZnO:Al/Ag/NiCr/ZnO:Al/$NiCrO_x$, wherein x indicates a stoichiometric amount of O in relation to Ni and Cr/$Si_3N_4$/TiZrHf($C_xO_yN_z$), wherein x, y and z indicate stoichiometric amounts of C, O and N, respectively.

9. The multilayer system of claim 1, which comprises a layer structure: substrate/$Si_3N_4$/$NiCrO_x$, wherein x indicates a stoichiometric amount of O in relation to Ni and Cr/ZnO:Al/Ag/NiCr/ZnO:Al/$NiCrO_x$, wherein x indicates a stoichiometric amount of O in relation to Ni and Cr/$Si_3N_4$/$TiZrHfYO_x$, wherein x indicates a stoichiometric amount of O in relation to Ti, Zr, Hf and Y.

10. The multilayer system of claim 1 which comprises a layer structure: substrate/$Si_3N_4$/$ZnSnO_x$, wherein x indicates a stoichiometric amount of O in relation to Zn and Sn/ZnO:Al/Ag/NiCr/ZnO:Al/$NiCrO_x$, wherein x indicates a stoichiometric amount of O in relation to Ni and Cr/$Si_3N_4$/TiZrHf($C_xO_yN_z$), wherein x, y and z indicate stoichiometric amounts of C, O and N, respectively.

11. Glazing comprising the multilayer system of claim 1.

12. The multilayer system of claim 1, wherein the upper antireflection coating comprises a partial layer of ZnO.

13. The multilayer system of claim 1, wherein the upper antireflection coating comprises a mixed oxide $ZnMeO_x$, wherein x indicates a stoichiometric amount of O in relation to Zn and Me, that contains ZnO.

14. The multilayer system of claim 1, wherein the upper antireflection coating comprises a succession of layers of mixed oxides comprising $ZnO:Al/ZnMeO_x$, wherein x indicates a stoichiometric amount of O in relation to Zn and Me.

15. The multilayer system of claim 1, wherein the upper antireflection coating comprises a partial layer of $Si_3N_4$.

16. The multilayer system of claim 1, wherein the upper antireflection coating comprises a partial layer of $Si_xO_yN_z$, wherein x, y and z indicate stoichiometric amounts of Si, O and N, respectively.

17. The multilayer system of claim 1, which comprises an arrangement selected from the group consisting of:

substrate (glass)/$Si_3N_4$/ZnO:Al/Ag/NiCr/ZnO:Al/ $NiCrO_x$, wherein x indicates a stoichiometric amount of O in relation to Ni and Cr/$Si_3N_4$/(topcoat);

substrate (glass)/$Si_3N_4$/$NiCrO_x$, wherein x indicates a stoichiometric amount of O in relation to Ni and Cr/ZnO:Al/Ag/NiCr/ZnO:Al/$NiCrO_x$, wherein x indicates a stoichiometric amount of O in relation to Ni and Cr/$Si_3N_4$/(topcoat);

substrate (glass)/$Si_3N_4$/$ZnSnO_x$, wherein x indicates a stoichiometric amount of O in relation to Zn and Sn/ZnO:Al/Ag/NiCr/ZnO:Al/$NiCrO_x$, wherein x indicates a stoichiometric amount of O in relation to Ni and Cr/$Si_3N_4$/(topcoat);

and substrate (glass)/$Si_3N_4$/$NiCrO_x$, wherein x indicates a stoichiometric amount of O in relation to Ni and Cr/$ZnSnO_x$, wherein x indicates a stoichiometric amount of O in relation to Zn and Sn/ZnO:Al/Ag/NiCr/ZnO/$ZnSnO_x$, wherein x indicates a stoichiometric amount of O in relation to Zn and Sn/$NiCrO_x$, wherein x indicates a stoichiometric amount of O in relation to Ni and Cr/$Si_3N_4$/(topcoat).

18. A low-emissivity multilayer system comprising a substrate bound to a lower antireflection coating covered by an upper antireflection coating;

wherein the lower antireflection coating comprises a layer of ZnO:Al; adjacent to a silver-based functional layer; adjacent to a metallic blocking layer; and wherein the upper antireflection coating comprises:

(i) a partial layer of ZnO or a mixed oxide $ZnMeO_x$, wherein x indicates a stoichiometric amount of O in relation to Zn and Me; that contains ZnO or a succession of layers of mixed oxides comprising $ZnO:Al/ZnMeO_x$, wherein x indicates a stoichiometric amount of O in relation to Zn and Me;

(ii) a cubic crystal lattice separating layer consisting essentially of a metal oxide or a mixed oxide and having a thickness of 0.5 to 5 nm; and (iii) a partial layer of $Si_3N_4$ or $Si_xO_yN_z$, wherein x, y and z indicate stoichiometric amounts of Si, O and N, respectively;

wherein (ii) is in between and in direct contact with (i) and (iii).

* * * * *